United States Patent
Choi et al.

(10) Patent No.: US 10,804,741 B2
(45) Date of Patent: Oct. 13, 2020

(54) WIRELESS POWER TRANSMISSION DEVICE AND WIRELESS POWER TRANSMISSION SYSTEM

(71) Applicants: SAMSUNG ELECTRONICS CO., LTD., Suwon-si, Gyeonggi-do (KR); KOREA ADVANCED INSTITUTE OF SCIENCE AND TECHNOLOGY, Daejeon (KR)

(72) Inventors: Young-ho Choi, Suwon-si (KR); Chun-taek Rim, Gwangju (KR); Eun-soo Lee, Daejeon (KR); Byeong-guk Choi, Daejeon (KR); Jin-soo Choi, Daejeon (KR); Kyu-sung Lee, Ansan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 52 days.

(21) Appl. No.: 16/330,658

(22) PCT Filed: Sep. 1, 2017

(86) PCT No.: PCT/KR2017/009607
§ 371 (c)(1),
(2) Date: Mar. 5, 2019

(87) PCT Pub. No.: WO2018/044121
PCT Pub. Date: Mar. 8, 2018

(65) Prior Publication Data
US 2019/0229556 A1 Jul. 25, 2019

(30) Foreign Application Priority Data

Sep. 5, 2016 (KR) .......................... 10-2016-0114044

(51) Int. Cl.
*H01F 27/42* (2006.01)
*H01F 37/00* (2006.01)
(Continued)

(52) U.S. Cl.
CPC ............. *H02J 50/10* (2016.02); *H01Q 9/285* (2013.01); *H02J 7/025* (2013.01); *H02J 50/70* (2016.02);
(Continued)

(58) Field of Classification Search
CPC . H02J 5/005; H02J 7/025; H02J 17/00; H01F 38/14; B60L 11/182
(Continued)

(56) References Cited

U.S. PATENT DOCUMENTS 6,480,088 B2 * 11/2002 Okamoto ................ H01F 17/04
336/208
9,246,359 B2 1/2016 Moon et al.
(Continued)

FOREIGN PATENT DOCUMENTS

JP 2013-207727 10/2013
JP 2014-072968 A 4/2014
(Continued)

OTHER PUBLICATIONS

International Search Report dated Dec. 13, 2017 from International Patent Application No. PCT/KR2017/009607.
(Continued)

*Primary Examiner* — Anh Q Tra
(74) *Attorney, Agent, or Firm* — Staas & Halsey LLP

(57) ABSTRACT

Provided are a wireless power transmission device and a wireless power transmission system. The wireless power transmission device, according to one embodiment of the present invention, may comprise: a dipole coil comprising a core, and a conducting wire wound at the center part of the
(Continued)

core; a power unit for supplying a current to the conducting wire; and a canceling coil for canceling a magnetic field radiated from a lateral surface of the dipole coil.

15 Claims, 17 Drawing Sheets

(51) Int. Cl.
| | |
|---|---|
| *H01F 38/00* | (2006.01) |
| *H02J 50/10* | (2016.01) |
| *H05K 9/00* | (2006.01) |
| *H02J 50/70* | (2016.01) |
| *H01Q 9/28* | (2006.01) |
| *H02J 7/02* | (2016.01) |
| *H04B 5/00* | (2006.01) |

(52) U.S. Cl.
CPC ......... *H04B 5/0037* (2013.01); *H04B 5/0087* (2013.01); *H05K 9/00* (2013.01)

(58) Field of Classification Search
USPC ........................................................ 307/104
See application file for complete search history.

(56) References Cited

U.S. PATENT DOCUMENTS

| | | |
|---|---|---|
| 9,903,927 B2 | 2/2018 | Hwang et al. |
| 2013/0229064 A1 | 9/2013 | Moon et al. |
| 2013/0271145 A1 | 10/2013 | Hwang et al. |
| 2014/0152250 A1* | 6/2014 | Vijayan ............... H02M 3/3353 320/108 |
| 2016/0118836 A1 | 4/2016 | Waldschmidt |
| 2018/0017599 A1* | 1/2018 | Ichikawa ............ H01F 27/2804 |
| 2018/0219425 A1* | 8/2018 | Choi ....................... H02J 50/40 |

FOREIGN PATENT DOCUMENTS

| | | |
|---|---|---|
| JP | 2014-110726 A | 6/2014 |
| JP | 2015-5617 | 1/2015 |
| JP | 2015-192505 | 11/2015 |
| KR | 10-2012-0065643 | 6/2012 |
| KR | 10-1152835 | 6/2012 |
| KR | 10-2013-0098099 | 9/2013 |
| KR | 10-2016-0039778 | 4/2015 |
| KR | 10-2015-0089350 | 8/2015 |
| KR | 10-2015-0102299 | 9/2015 |
| KR | 10-2016-0015055 | 2/2016 |
| KR | 10-2016-0090420 | 8/2016 |
| WO | 2016/048008 A1 | 3/2016 |
| WO | 2016/135895 A1 | 9/2016 |

OTHER PUBLICATIONS

Written Opinion of the International Searching Authority dated Dec. 13, 2017 from International Patent Application No. PCT/KR2017/009607.
Extended European Search Report dated Aug. 27, 2019 from European Patent Application No. 17847046.4, 7 pages.

* cited by examiner

US 10,804,741 B2

WIRELESS POWER TRANSMISSION DEVICE AND WIRELESS POWER TRANSMISSION SYSTEM

CROSS-REFERENCE TO RELATED APPLICATIONS

This application is a U.S. National Stage Application which claims the benefit under 35 U.S.C. § 371 of International Patent Application No. PCT/KR2017/009607 filed on Sep. 1, 2017, which claims foreign priority benefit under 35 U.S.C. § 119 of Korean Patent Application No. 10-2016-0114044 filed on Sep. 5, 2016 in the Korean Intellectual Property Office, the contents of both of which are incorporated herein by reference.

TECHNICAL FIELD

The disclosure relates to a wireless power transmission device and a wireless power transmission system. The disclosure relates to a wireless power transmission device which is capable of canceling a leakage magnetic field of a transception unit having a dipole coil structure, and a wireless power transmission system.

DESCRIPTION OF RELATED ART

A related-art wireless power transmission device mainly transceives electric power using a magnetic induction method by means of a loop-type coil. However, using a loop-type coil has a problem that a mutual inductance is low and that it cannot be used in a long-distance wireless power transmission, as compared with using a dipole coil.

However, using a dipole coil has a problem that a leakage magnetic field broadcasted to a surrounding space is large, in addition to a coupling magnetic field for power transmission between a transmission device and a reception device.

In particular, near a coil of a transception device from which a high-frequency magnetic field for wireless power transmission is generated (for example, within 30 cm from the transception device), the chances that a magnitude of a leakage magnetic field will exceed an international magnetic field standard is high.

Accordingly, in case a person is located in a surrounding area of a transception device, it is necessary to reduce a magnitude of a leakage magnetic field.

DETAILED DESCRIPTION

Technical Problem

Aspects of the disclosure are to address at least the above-mentioned problems and/or disadvantages and to provide at least the advantages described below. Accordingly, an aspect of the disclosure is to provide a wireless power transmission device which is capable of securing safety of a human body exposed to a high-frequency magnetic field by generating a magnetic field canceling a leakage magnetic field, and a wireless power transmission system.

Solution to Problem

In accordance with an aspect of the disclosure, a wireless power transmission device is provided. The wireless power transmission device includes a dipole coil comprising a core, and a conducting wire wound at the center part of the core, a power unit for supplying a current to the conducting wire, and a canceling coil for canceling a magnetic field radiated from a lateral surface of the dipole coil.

The canceling coil may include a first canceling coil which is disposed in a left area of the dipole coil, and a second canceling coil which is disposed in a right area of the dipole coil.

The canceling coil may have a shape of a dipole coil using a core rather than a shape of a loop coil including a closed loop.

The canceling coil may include a first canceling coil which is disposed in a front area of the dipole coil, and a second canceling coil which is disposed in a rear area of the dipole coil.

Each of the first canceling coil and the second canceling coil may have any one shape from among an integral type including a single dipole coil, and a distribution type including a plurality of dipole coils.

Each of the first canceling coil and the second canceling coil may have a shape that a rectangular closed line is bent twice in parallel.

The first canceling coil may include a front surface of a ']' shape with reference to the dipole coil, and an upper surface of a '[' with reference to the dipole coil. The second canceling coil may include a front surface of a '[' shape with reference to the dipole coil, and an upper surface of a ']' with reference to the dipole coil.

A portion of a left side of the dipole coil may be disposed inside the first canceling coil. A portion of a right side of the dipole coil may be disposed inside the second canceling coil.

The canceling coil further may include a plurality of third canceling coils of a rectangular closed line form which is disposed in parallel with a lateral surface of the dipole coil, between the first canceling coil and the second canceling coil.

The canceling coil may be configured to generate an induced electromotive force by a magnetic field radiated from the dipole coil, and to radiate a canceling magnetic field to cancel a magnetic field radiated from the dipole coil based on the generated induced electromotive force.

The wireless power transmission device may further include a canceling power unit for supplying, to the canceling coil, a current to control the canceling coil to radiate a canceling magnetic field canceling a magnetic field radiated from the dipole coil.

The canceling power unit may be configured to supply, to the canceling coil, a current with a phase difference of 180 degrees from a current supplied from the power unit.

The canceling coil may have an impedance of an inductive load.

The wireless power transmission device may further include a metal plate which is disposed at a lower part or lateral surface of the dipole coil and cancels a magnetic field radiated from the lower part or lateral surface of the dipole coil.

The wireless power transmission device may further include a metal plate for canceling a magnetic field radiated from an upper part of the first canceling coil and the second canceling coil.

In accordance with another aspect of the disclosure, a wireless power transmission system is provided. The wireless power transmission system includes: a wireless power reception device; a wireless power transmission device including a first dipole coil including a first core, and a first conducting wire wound at the center part of the first core; and a canceling coil for canceling a magnetic field radiated from a direction other than a direction in which the wireless power reception device is disposed. The wireless power reception device may include a second coil for generating a current when a magnetic field radiated from the wireless power transmission device is applied.

The second coil may be a second dipole coil including a second core and a second conducting wire wound at the center part of the second core.

The canceling coil may include a first canceling coil which is disposed in a left area of the first dipole coil, and a second canceling coil which is disposed in a right area of the first dipole coil. Each of the first canceling coil and the second canceling coil may have a shape that a rectangular closed line is bent twice in parallel.

The first canceling coil may include a front surface of a ']' shape with reference to the dipole coil, and an upper surface of a '[' with reference to the dipole coil. The second canceling coil may include a front surface of a '[' shape with reference to the dipole coil, and an upper surface of a ']' with reference to the dipole coil.

Effect of the Invention

According to the various example embodiments, even when wireless power transmission employing a dipole coil structure is performed, an effect that a magnetic field leaking near a coil is reduced to under an international magnetic field structure can be secured.

EMBODIMENTS FOR CARRYING OUT THE INVENTION

Hereinafter, preferred embodiments of the present disclosure will be described in detail with reference to the accompanying drawings. For reference, when it is determined that the detailed description of the known function or configuration may obscure the gist of the embodiments in describing them, the detailed description thereof will be omitted. Among the terms used herein, those that are defined in the dictionaries may be interpreted based on the same or similar definitions that can be understood in the associated technical context, and unless specifically defined otherwise, these are not interpreted as ideal or unnecessarily formal ways. Therefore, the terms used in the exemplary embodiments should be defined based on the meaning thereof and the descriptions of the present disclosure, rather than based on their names only.

The term such as "first" and "second" used in various example embodiments may modify various elements regardless of an order and/or importance of the corresponding elements, and does not limit the corresponding elements. In embodiments of the present disclosure, relational terms such as first and second, and the like, may be used to distinguish one entity from another entity, without necessarily implying any actual relationship or order between such entities. For example, a first element may be named a second element without departing from the scope of right of various example embodiments, and similarly, a second element may be named a first element. The term of and/or includes combination or one of a plurality of related items recited.

The terms used in the following description are provided to explain example embodiments and are not intended to limit the scope. It is to be understood that the singular forms "a," "an," and "the" include plural referents unless the context clearly dictates otherwise. The terms, "include", "comprise", "is configured to", etc. of the description are used to indicate that there are features, numbers, steps, operations, elements, parts or combination thereof, and they should not exclude the possibilities of combination or addition of one or more features, numbers, steps, operations, elements, parts or combination thereof.

Figure 1:
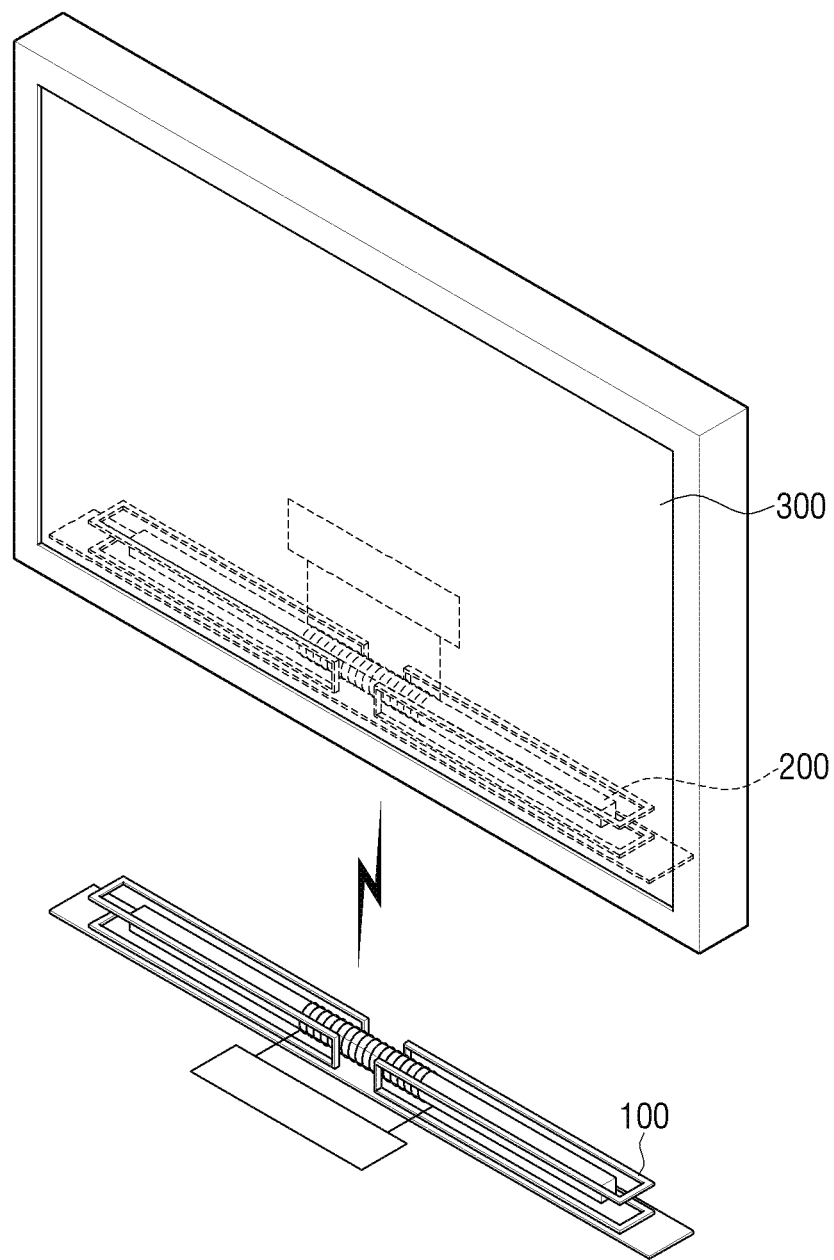
FIG. 1 is a conceptual diagram illustrating a wireless power transmission system, according to an example embodiment.

FIG. 1 is a conceptual diagram illustrating a wireless power transmission system 1000, according to an example embodiment. As in the embodiment of FIG. 1, a wireless power reception device 200 may be included inside a display device 300 such as a wall-mountable TV. In addition, the wireless power transmission device 100 may be installed in a bar-type box form at the bottom part of the display device 300.

In addition, the wireless power transmission device 100 may be implemented as being integral to an element performing an image processing function and a set-top box function. In this case, the wireless power transmission device 100 may wirelessly transmit not only power to the electronic device 300 but also an image data, a broadcast signal, etc. Accordingly, the display device 300 may only include a display panel (not shown), a wireless power reception device 200, and a minimum control circuit configuration, and thus a far thinner display device 300 can be realized.

As illustrated in the embodiment of FIG. 1, the chances that the wireless power transmission device 100 is disposed at a position close to the user, and thus it is necessary to cancel a magnetic field so that the user is not exposed to a leakage magnetic field over an international magnetic field standard.

The wireless power transmission device 100 according to an example embodiment may include an element for canceling a leakage magnetic field which is applicable to a dipole coil structure. Through this, the wireless power transmission device 100 may be designed such that a leakage magnetic field is less than or equal to an international magnetic field standard (for example, in accordance with the ICNIRP Guideline, 27 uT, and in accordance with the EN62233, 6.25 uT). The detail will be described with reference to the drawings shown below.

Figure 2:
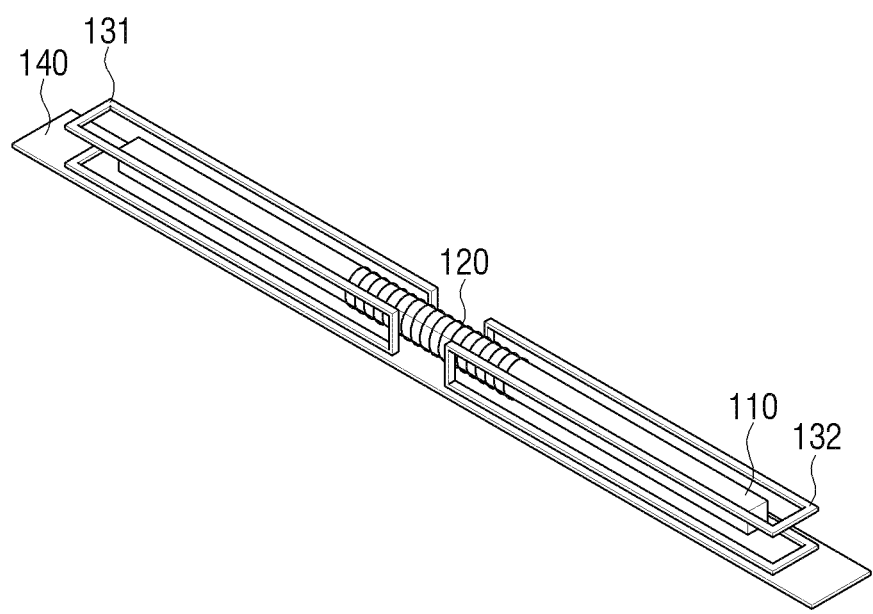
FIG. 2 is a diagram illustrating a wireless power transmission device, according to an example embodiment.

FIG. 2 is a diagram illustrating a wireless power transmission device 100, according to another example embodiment. The wireless power transmission device 100 may include a core 110, a conducting wire 120, a canceling coil 130, and a metal plate 140. To explore the structure of the canceling coil 130 in detail, an element of a power unit 150 is not shown.

Referring to FIG. 2, the wireless power transmission device 100 may include a dipole coil comprising a core 110, and a conducting wire 120 wound at the center part of the core 110. Through the structural feature, the dipole coil may broadcast a magnetic field toward all directions of three dimensions, when a current is supplied to the conducting wire 120.

The core 110 may be used to increase a magnetic flux transfer. The core 110 may be in a long shape in a longitudinal direction. For example, the core 110 may be of a uniform thickness as illustrated in FIG. 2.

As another example, the core 110 may have a thickest central portion in the longitudinal direction and a tapered shape toward both ends. A plurality of disc-type rectangular core members may be overlapped and implemented in this way. An embodiment in which a thickness of the core 110 is implemented differently in a longitudinal direction has an advantage that a magnitude of a magnetic field for wireless power transfer is further uniformly distributed when a distance from the core 110 is consistent.

The conducting wire 120 may be wound at the center part of the core 110. For example, the conducting wire 120 may be wound in a helical form at the center part of the core 110. As current flows through the conducting wire 120, a dipole coil may broadcast a magnetic field.

The power unit 150 (not shown) may be connected to the conducting wire 120 and supply a current. The power unit 150 may include a power supply 151 for supplying a direct current, and an inverter 153 for converting the supplied DC power into AC power. The power supply unit 150 may supply AC power to the conducting wire 120.

In the embodiment of FIG. 2, it is assumed that a wireless power reception device 200 is disposed at the upper part of the wireless power transmission device 100. The wireless power transmission device 100 may cancel or shield a magnetic field which is radiated toward the remaining directions other than an upper direction.

The canceling coil 130 may cancel a magnetic field radiated from a lateral surface of the dipole coil. The canceling coil 130 may generate an induced electromotive force by the magnetic field radiated from the dipole coil. Further, by the generated induced electromotive force, the canceling coil 130 may radiate a canceling magnetic field which cancels a magnetic field radiated from a dipole coil because an induced electromotive force is generated so that a shift of magnetic flux passing through the canceling coil 130 is reduced.

To this end, impedance of the canceling coil 130 may be designed as an inductive load. When the impedance of the canceling coil 130 is designed as an inductive load, a current generated from the canceling coil 130 by the induced electromotive force may radiate a canceling magnetic field having a phase difference of 180 degrees from a magnetic field radiated from the dipole coil.

In consideration of a structure of a dipole coil, when a canceling coil 130 of a form illustrated in FIG. 2 is provided, a leakage magnetic field radiated toward a lateral surface of the dipole coil may be cancelled.

In detail, the canceling coil 130 may include a first canceling coil 131 which is disposed in a left area of the dipole coil, and a second canceling coil 132 which is disposed in a right area of the dipole coil. In addition, the first canceling coil 131 and the second canceling coil 132 may be disposed as being spaced apart a predetermined distance from each other.

The first canceling coil 131 and the second canceling coil 132 may respectively have a shape that a rectangular closed line is bent twice in parallel. The detailed shape of the first and second canceling coils 131 and 132 will be described in detail with reference to FIG. 2.

The first canceling coil 131 may have a ']' shape when viewed from a front surface with reference to the dipole coil, and have a '[' shape when viewed from an upper part. The second canceling coil 132 may form symmetry with the first canceling coil 131 with reference to a center part of the dipole coil. The second canceling coil 132 may have a '[' shape when viewed from a front surface with reference to the dipole coil, and have a ']' shape when viewed from an upper part.

A part of left side of the dipole coil may be disposed inside the first canceling coil 131, and a part of right side of the dipole coil may be disposed inside the second canceling coil 132.

The metal plate 140 may be disposed at a bottom part of the dipole coil, and cancel a magnetic field radiated to the bottom part of the dipole coil.

The wireless power reception device 200 according to an example embodiment may have a structure corresponding to the wireless power transmission device 100. That is, the wireless power reception device 200 may include a core 210, a conducting wire 220 wound at the center part of the core 210, and a canceling coil 230. However, the power unit 240 may include a rectifier and convert an induced AC current into a DC power.

A principle of canceling, by the canceling coil 131, a magnetic field leaked from a dipole coil will be described with reference to FIGS. 3A and 3B.

Figure 3A:
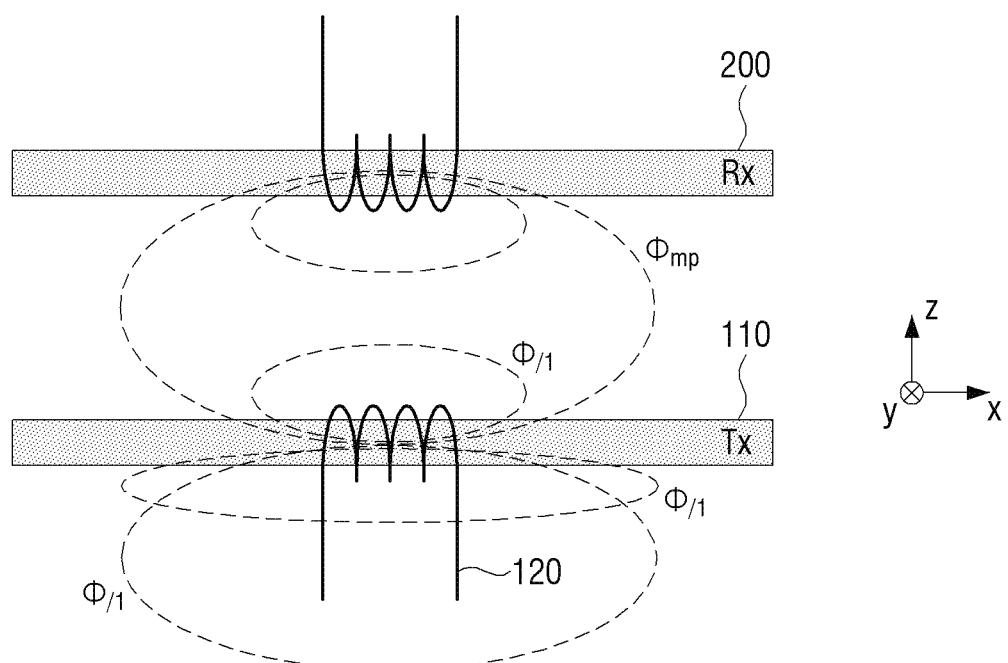
FIGS. 3A and 3B are diagrams illustrating canceling of a magnetic field of a wireless power transmission device, according to an example embodiment.

Referring to FIG. 3A in which no canceling coil 131 is present, a transmission coil Tx of the wireless power transmission device 100 has a magnetic flux ($\varphi_{l1}$) which is leaked toward a different direction in addition to a magnetic flux ($\varphi_{mp}$ of +z direction) toward a reception coil (Rx) direction.

The canceling coil 130 may cancel a magnetic field which is radiated toward a lateral surface direction (−y direction which is a front surface direction, +y direction which is a rear surface direction, and −x and +x directions which are respectively a left lateral surface direction and a right lateral surface direction) excluding a reception coil Rx direction.

Figure 3B:
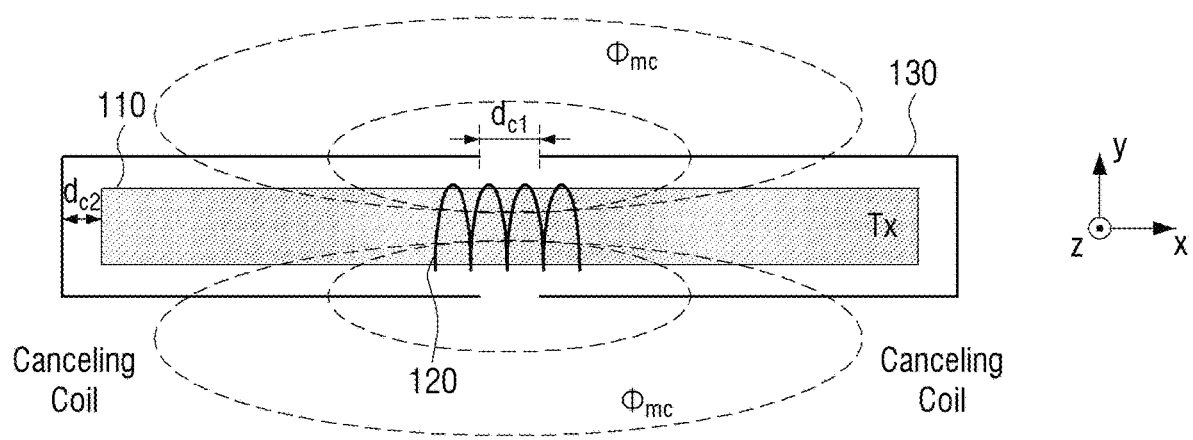

FIG. 3B is a diagram illustrating a wireless power transmission device 100 viewed from an upper part. The first canceling coil 131 disposed in a left area of a dipole core may have a '[' shape when viewed from an upper part, and the second canceling coil 132 disposed in a right area of the dipole core may have a ']' shape when viewed from an upper part. In addition, the first canceling coil 131 and the second canceling coil 132 may be disposed as being spaced apart from each other by $d_{c1}$ from a center part of the dipole coil. In addition, the first canceling coil 131 and the second canceling coil 132 may be disposed as being spaced apart from each other by $d_{c2}$ from the opposite ends of the dipole coil.

The canceling coil 131 may radiate a canceling magnetic field canceling a magnetic field radiated toward a lateral surface. When the canceling coil 130 is applied, as illustrated in FIG. 3B, a leakage magnetic flux $\varphi_{l1}$ generated from the transmission coil Tx is reduced with the increase in a magnetic flux $\varphi_{mc}$ interlinked between the transmission coil Tx and the canceling coil.

In addition, a leakage magnetic flux of a −z direction among leakage magnetic flux components of the transmission coil Tx may be shielded using a metal plate 140.

At a reception coil Rx on the wireless power reception device 200 side in addition to the wireless power transmission device 100, the canceling coil 230 may be disposed on the same principle.

Figure 4A:
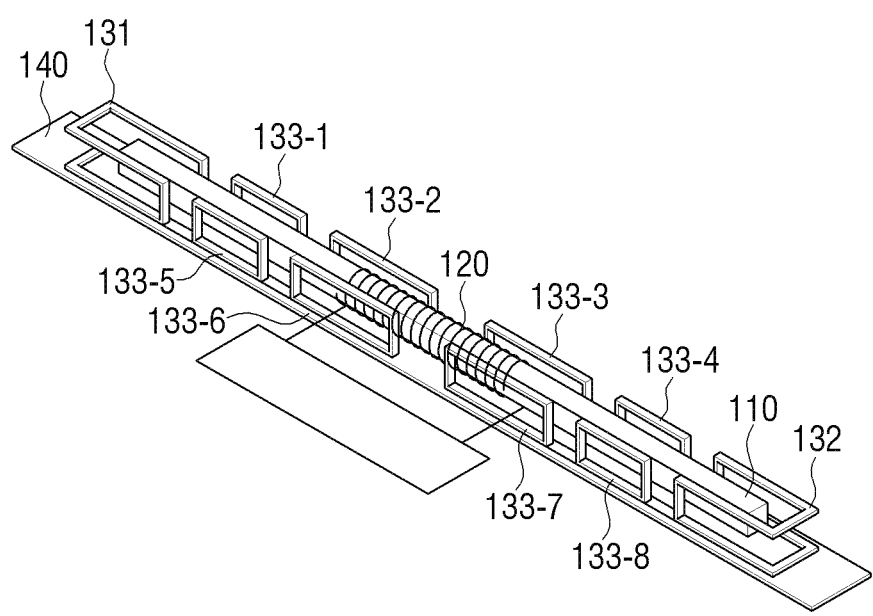
FIGS. 4A and 4B are diagrams illustrating a wireless power transmission device, according to another example embodiment.
Figure 4B:
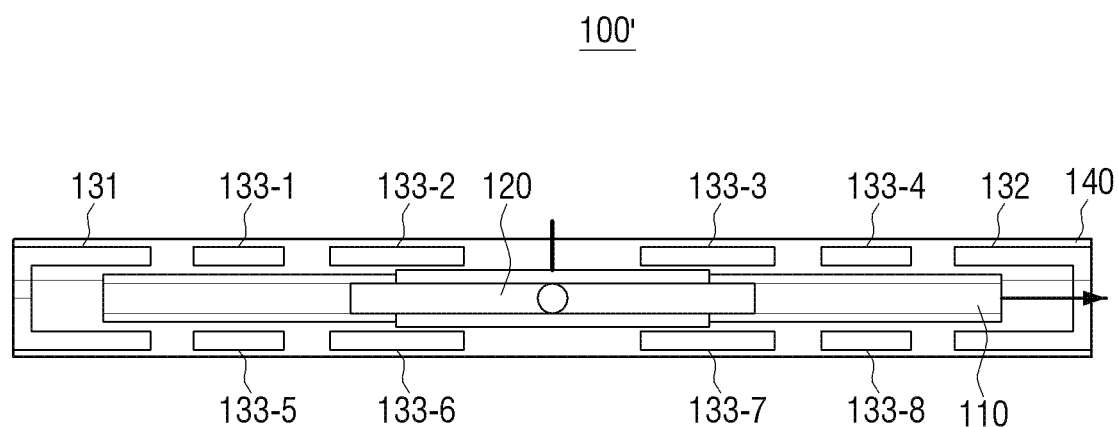

FIGS. 4A and 4B are diagrams illustrating a wireless power transmission device 100', according to another example embodiment. A leakage magnetic field generated from a dipole coil may be in different sizes according to a position of longitudinal direction of a dipole coil. A leakage magnetic field at a center part of the dipole coil may be larger than that of the opposite ends of the dipole coil.

In the wireless power transmission device 100 according to an example embodiment illustrated in FIG. 2, a magnitude of a magnetic field generated from the canceling coil 130 may be identical at all positions of the canceling coil 130. In contrast, the wireless power transmission device 100' illustrated in FIGS. 4A and 4B may further include a plurality of third canceling coils 133 respectively radiating different canceling magnetic fields, so that a leakage magnetic field which is different for each position of the dipole coil may be cancelled as much as possible.

The plurality of third canceling coils 133 may be implemented in the form of a rectangular closed line. In addition, the plurality of third canceling coils 133 may be disposed between the first canceling coil 131 and the second canceling coil 132, and may be disposed in parallel with a lateral surface of the dipole coil.

Referring to FIGS. 4A and 4B, a canceling magnetic field radiated from the third canceling coils 133-2, 133-3, 133-6 and 133-7 which are closest to a center part of the dipole coil may be relatively larger than that radiated from the first canceling coil 131 and the second canceling coil 132. In addition, a canceling magnetic field radiated from the first canceling coil 131 and the second canceling coil 132 may be the smallest.

The number of windings of a canceling coil may be differently set or an intensity of current flowing through the canceling coil may be differently set by varying a resonance capacitor, and thereby each of the plurality of third canceling coils 133 may modify a magnitude of radiated canceling magnetic field. As another example, a canceling power unit 160 may be connected to each of the plurality of canceling coils 130, and a current of different sizes may be supplied from the respective canceling power units 160.

Figure 5A:
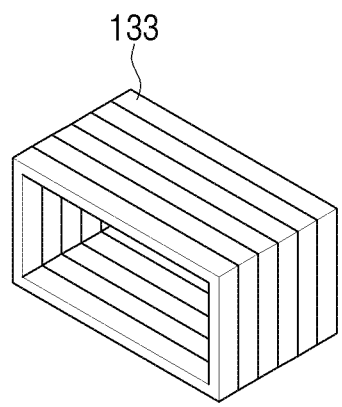
FIGS. 5A and 5B are diagrams illustrating a method for increasing the number of windings of a third canceling coil, according to an example embodiment.
Figure 5B:
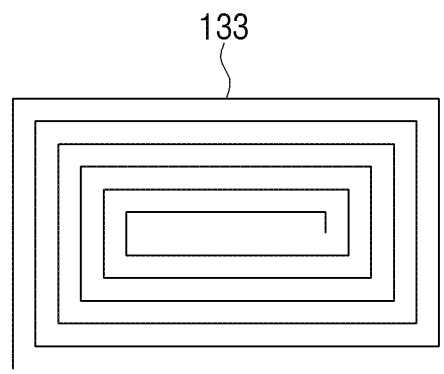

FIGS. 5A and 5B are diagrams illustrating a method for increasing the number of windings of a third canceling coil, according to an example embodiment. When the number of windings increases, a magnitude of a canceling magnetic field radiated from the third canceling coil 133 is increased. Accordingly, the closer a winding is disposed to a center portion of the dipole coil, the larger the number of windings of the third canceling coil 133.

Referring to FIG. 5A, the third canceling coil 133 may increase the number of windings of a conducting wire in a thickness direction. Referring to FIG. 5B, the third canceling coil 133 may increase the number of windings of a conducting wire in an inward direction.

In the embodiment of FIG. 5A, when the number of windings doubles, an amount of interlinkage of magnetic flux radiated from a dipole coil doubles, and thus a canceling magnetic field of the canceling coil 130 can be easily increased. However, a thickness of a center part of the wireless power transmission device 100 may be increased.

In the embodiment of FIG. 5B, a thickness of the respective third canceling coils 133 may be maintained constantly. However, even if the number of windings doubles, an amount of interlinkage of magnetic flux radiated from the dipole coil may be increased by less than two times.

It may be understood that a demand for miniaturization and an increment of canceling magnetic field are in a trade-off relationship of some sort. Accordingly, according to an actual specification of implementation of the wireless power transmission device 100', the methods for increasing the number of windings illustrated in FIGS. 5A and 5B may be appropriately combined with each other.

As another example, a magnitude of canceling magnetic field may be modified by fixing the number of windings of the plurality of third canceling coils 133 and changing a size of a resonance capacitor. An embodiment of changing a size of a resonance capacitor will be described again later with reference to FIGS. 8 and 9.

In the embodiment of FIG. 1, there may be a case where a rear wall on which the display device 300 and the wireless power transmission device 100 are disposed is made of concrete, etc., and thus that it is not necessary to consider a leakage magnetic field rearward. In this case, a form of the canceling coil 130 can be further simplified.

Figure 6A:
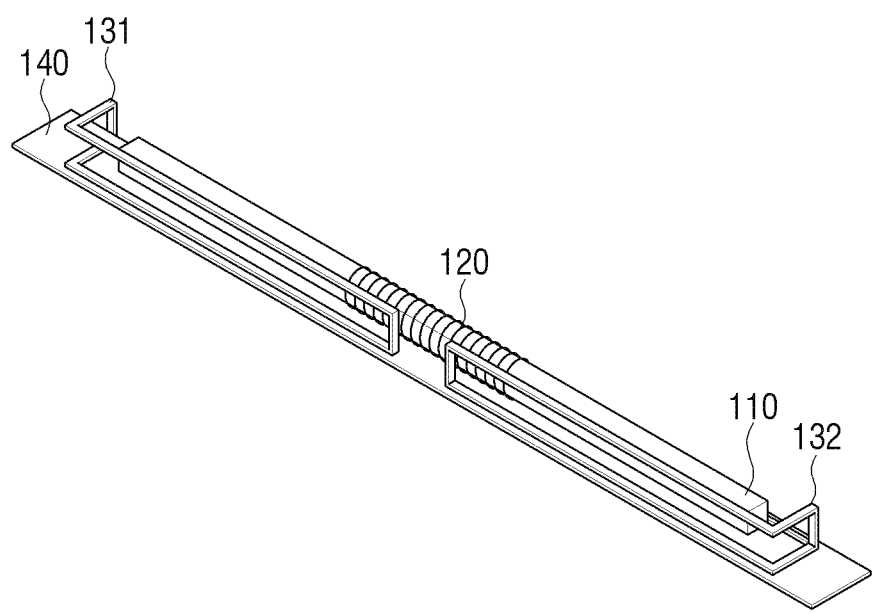
FIGS. 6A, 6B and 7 are diagrams illustrating a wireless power transmission device, according to various example embodiments.
Figure 6B:
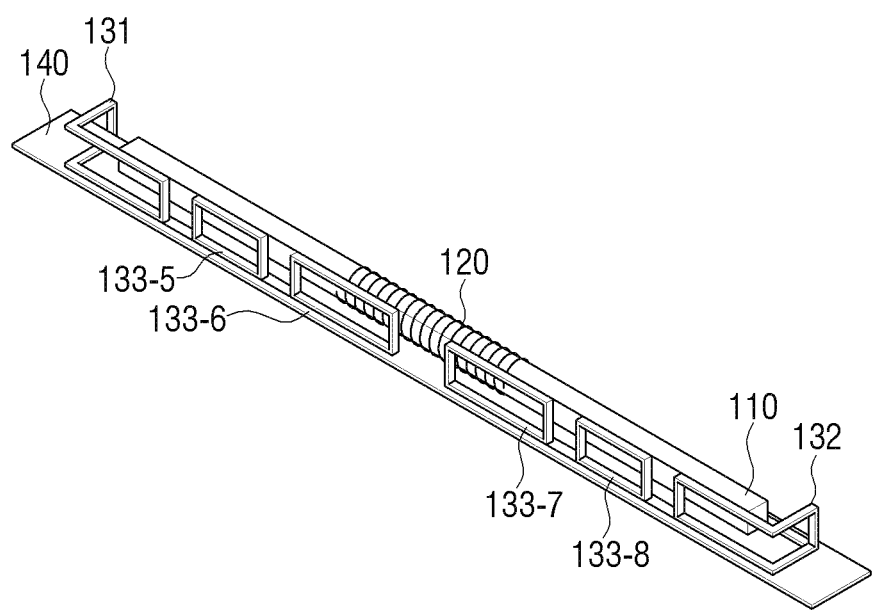

The wireless power transmission device 100" illustrated in FIG. 6A is an embodiment of FIG. 2 from which the canceling coil 130 present on the rear surface is removed. In addition, the wireless power transmission device 100" illustrated in FIG. 6B is an embodiment of FIG. 4A from which the canceling coil 130 present on the rear surface is removed. As described above, it is possible to implement modified embodiments where a canceling coil 130 of a particular direction is removed in consideration of an installation environment.

Figure 7:
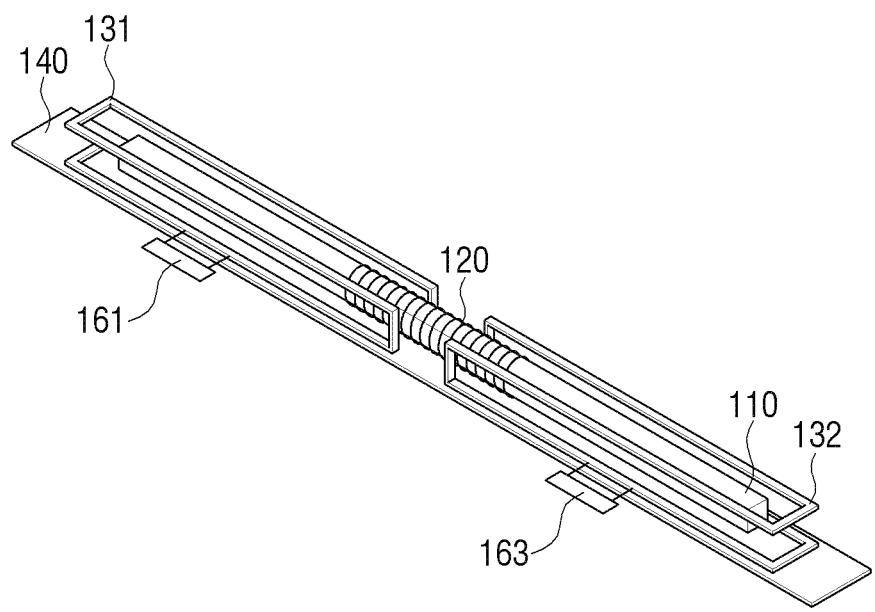

FIG. 7 is a diagram illustrating a wireless power transmission device 100''', according to an example embodiment. Referring to FIG. 7, the wireless power transmission device 100''' may further include a canceling power unit 160.

The canceling power unit 160 may directly supply a current to the canceling coil 130, and control the canceling coil 130 to radiate a canceling magnetic field which cancels a magnetic field radiated from a dipole coil. The canceling power unit 160 may supply, to the canceling coil 130, an AC current supplied to the conducting wire 120 of the dipole coil and a current having a phase difference of 180 degrees.

Referring to FIG. 7, a canceling power unit 161 and 163 may be respectively connected to the first canceling coil 131 and the second canceling coil 132 and supply an alternating current. In an embodiment in which a plurality of third canceling coils 133 are included, a canceling power unit 160 may be connected to each of the plurality of third canceling coils 133 and supply an alternating current. In addition, the canceling power unit 160 may supply an alternating current of different magnitudes according to a location of disposition of the plurality of third canceling coils 133.

Figure 8:
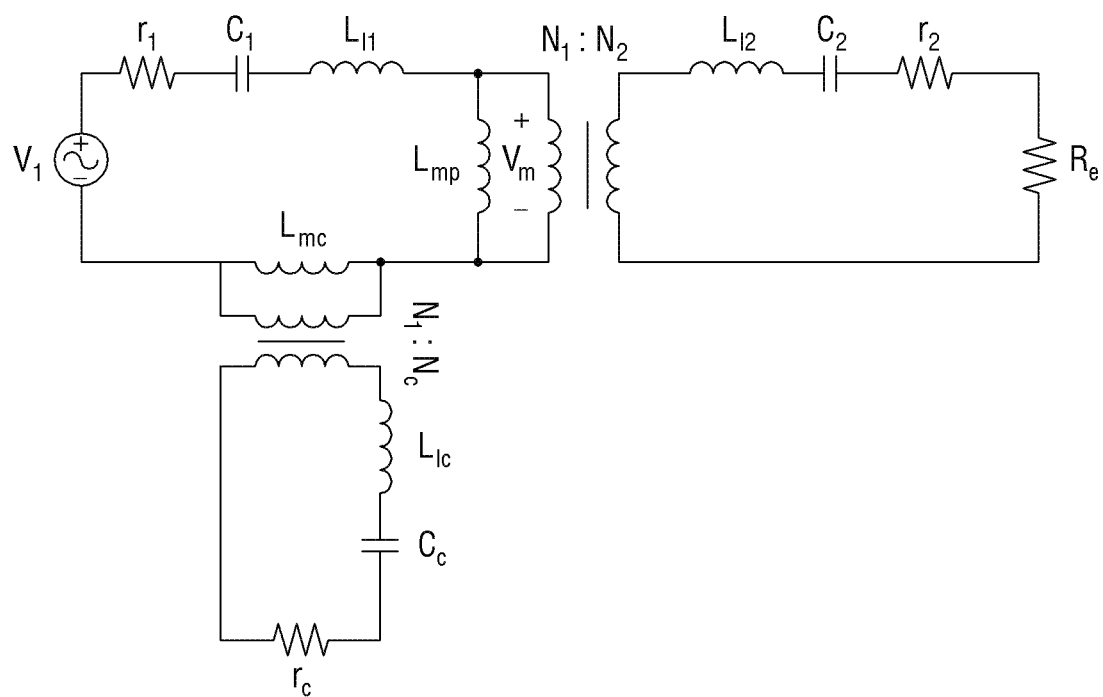
FIGS. 8 and 9 are diagrams illustrating a case where a canceling coil is modeled to an equivalent circuit.

FIG. 8 is a diagram illustrating a case where the canceling coil 130 is modeled to an equivalent circuit. The upper left circuit indicates a wireless power transmission device 100 excluding the canceling coil 130. The upper right circuit indicates a wireless power reception device 200. In addition, the bottom circuit indicates the canceling coil 130.

By a disposition form of the canceling coil 130, the canceling coil 130 and the wireless power reception device 200 are physically at right angles and thus, a coupling coefficient is 0. Accordingly, the canceling coil 130 may be modeled such that the canceling coil 130 is magnetically coupled to only the wireless power transmission device 100.

The canceling coil 130 may be coupled to a dipole coil of the wireless power transmission device 100 with a mutual inductance of $L_{mc}$.

Figure 9:
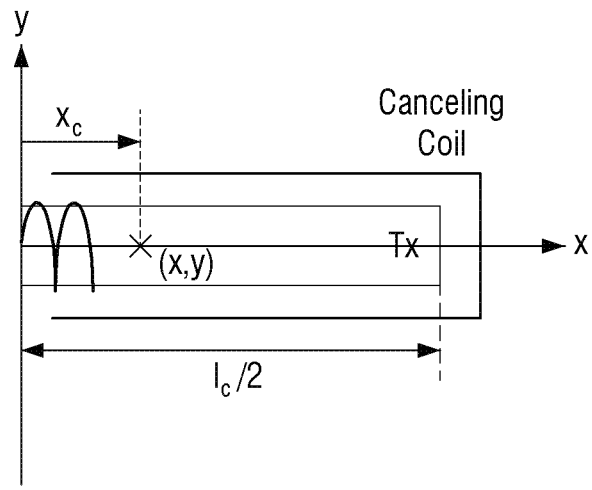
Figure 9:
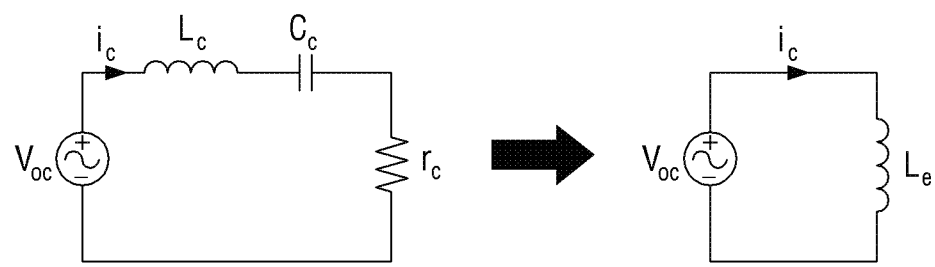

FIG. 9 is a diagram illustrating a shape of the canceling coil 130 and an equivalent circuit. A method for changing a magnitude of a canceling magnetic field of the canceling coil 130 by changing a resonance capacitor will be described with reference to FIG. 9.

When a magnetic field $B_{1,avg}$ generated from a dipole coil is interlinked to the canceling coil 130, in the canceling coil 130, a voltage of $V_{oc}$ is induced by an induced electromotive force (see mathematical formula 1). In the mathematical formula 1, the $\omega_s$ is a frequency of a current, the $N_c$ is the number of windings, and the $A_c$ is a cross-sectional area in which a magnetic field generated from the dipole coil of the canceling coil 130 is interlinked.

$$|V_{OC}| = \omega_s N_c B_{1,avg} A_c \quad \text{[Mathematical formula 1]}$$

The $B_{1,avg}$ value may be calculated as shown in mathematical formula 2 because a magnetic field $B_1(x)$ generated based on a location of longitudinal direction of a dipole coil is different. In the mathematical formula 2, the $I_c$ denotes a length of a core 110.

$$B_{1,avg} = \frac{1}{I_c} \int_{-\frac{I_c}{2}}^{\frac{I_c}{2}} B_1(x) dx \quad \text{[Mathematical formula 2]}$$

A current generated on the canceling coil 130 from the induced electromotive force $V_{oc}$ may be calculated as shown in mathematical formula 3. The $r_c$ is an internal resistance of the canceling coil 130, the $L_c$ is a resonance inductance of the canceling coil 130, the $C_c$ is a resonance capacitor of the canceling coil 130, and the $L_e$ is an effective inductance generated by $L_c$ and $C_c$.

$$|I_c| = \left| \frac{V_{OC}}{I\omega_s L_c + \frac{1}{I\omega_s C_c} + r_c} \right| = \quad \text{[Mathematical formula 3]}$$

$$\frac{V_{OC}}{\omega_s L_e} = \frac{V_{OC}}{Z_e} \left( r_c \equiv 0, L_e \equiv L_c - \frac{1}{\omega_s^2 C_c} \right)$$

As shown in the mathematical formula 3, a magnitude of a current Ic induced to the canceling coil 130 may be changed by varying a resonance capacitor $C_c$ of the canceling coil 130. Based on a disposition position toward a longitudinal direction of the dipole core, a resonance capacitor of each of the plurality of canceling coils 130 may be differently adjusted.

A canceling magnetic field generated from the canceling coil 130 may be calculated as shown in mathematical formula 4. When a load of the canceling coil 130 is designed as an inductive load, a current $I_c$ of the canceling coil 130 may have a phase difference of 180 degrees as compared with a current supplied from the power unit 150.

A canceling magnetic field generated from the canceling coil 130 may cancel a leakage magnetic field generated from the dipole coil from an effective distance $d_e$ of an arbitrary point (x, y). The $\alpha$ is an arbitrary constant which is determined by limited conducting wires of three directions.

$$B_c |_{x=x_c} = \quad \text{[Mathematical formula 4]}$$

$$\alpha \frac{\mu_0 N_c I_c}{2\pi d_e} = \alpha \frac{\mu_0 N_c}{2\pi d_e} \frac{V_{OC}}{Z_e} = \alpha \frac{\mu_0 N_c^2 f_s A_c}{d_e Z_e} B_{1,avg}$$

As described above, the wireless power transmission device 100 according to an example embodiment may adjust the $C_c$ under the given $f_s$, $N_c$, $A_c$, and $d_e$, and thereby cancel $B_{1,avg}$ through generation of $B_c$ and implement a low EMF so that the user is safe from a magnetic field.

Figure 10:
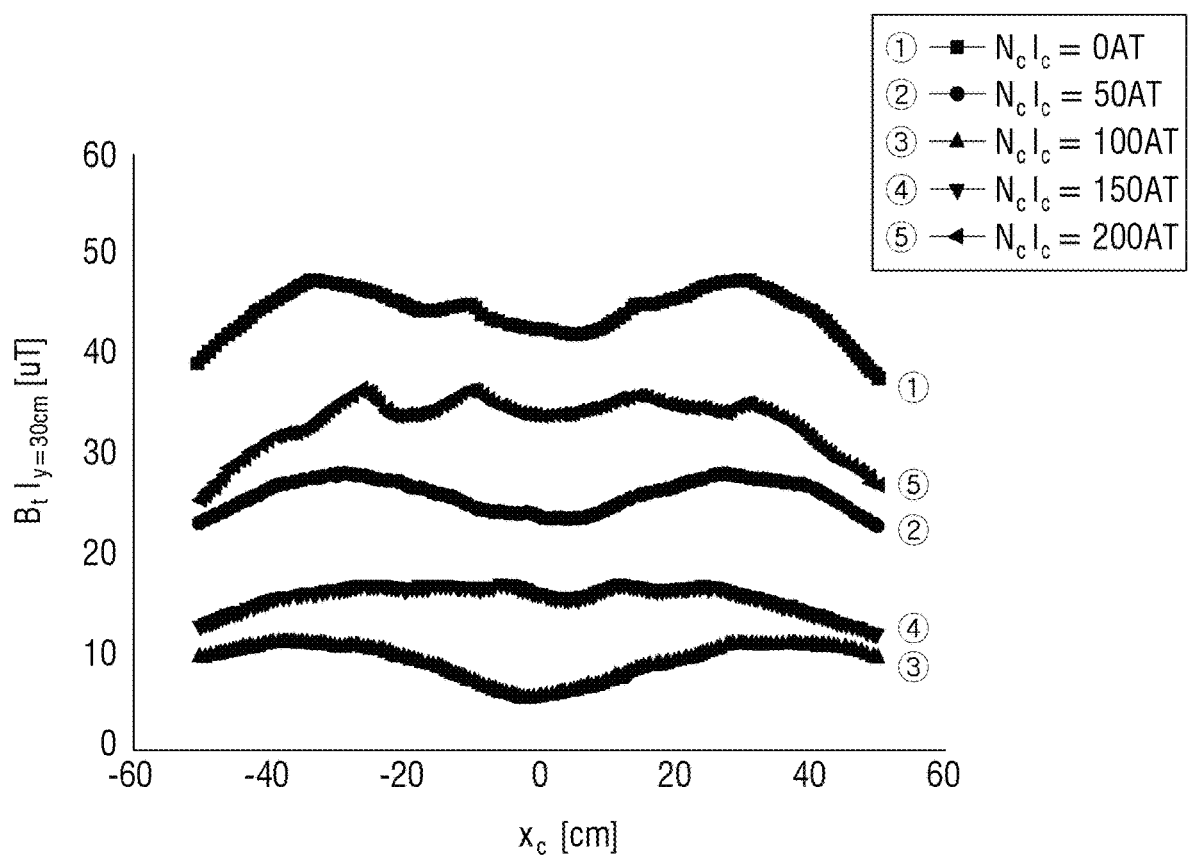
FIGS. 10, 11A and 11B are diagrams illustrating experiment data for explaining an effect of canceling a leakage magnetic field, according to an example embodiment.
Figure 11A:
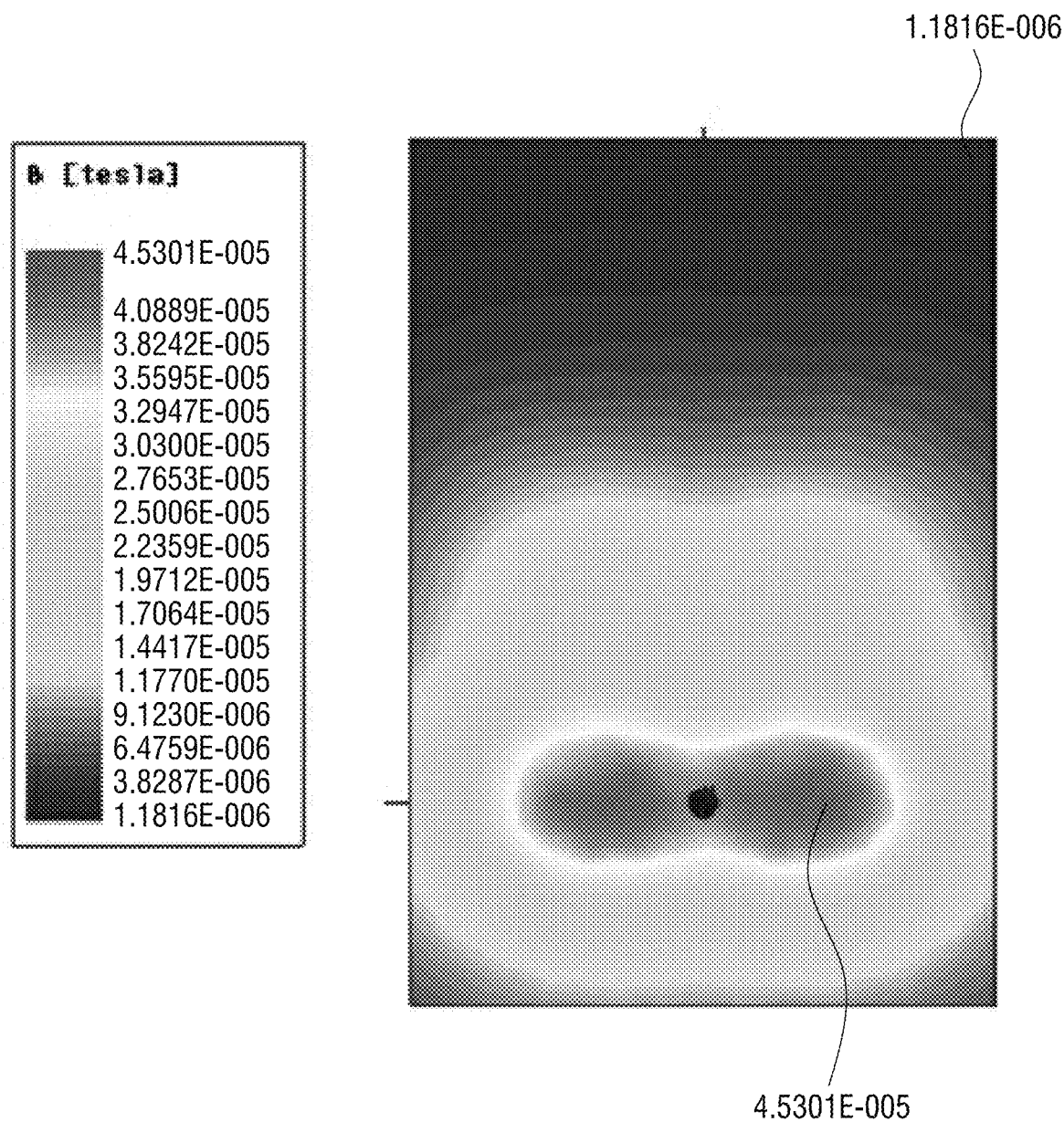
Figure 11B:
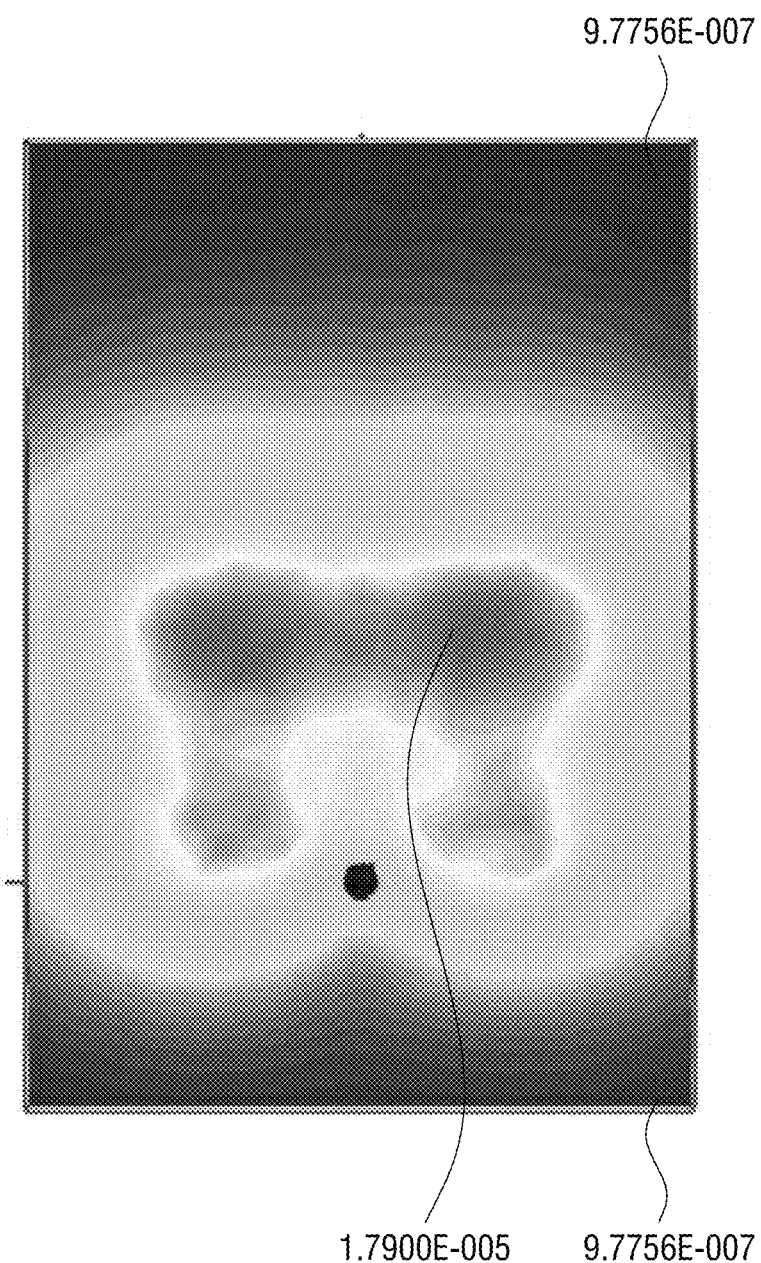

FIGS. 10, 11A and 11B are diagrams illustrating experiment data for explaining an effect of canceling a leakage magnetic field, according to an example embodiment.

FIG. 10 is an experiment data in a case where an ampere turn of the wireless power transmission device 100 is 140 AT and an ampere turn of the wireless power reception device 200 is 90 AT. FIG. 10 is a graph of measurements of a magnetic field at a 30 cm distance toward a front surface (−y direction) of the wireless power transmission device 100 in which the canceling coil 130 is provided.

In FIG. 10, it can be understood that an optimum ampere turn of the canceling coil 130 is 100 AT. The wireless power transmission device 100 according to an example embodiment to which the canceling coil 130 is applied may obtain a magnetic field canceling effect of approximately 75% even in the absence of an additional canceling power unit 160.

This effect can be understood through FIGS. 11A and 11B. FIG. 11A is a magnetic field distribution diagram when the canceling coil 130 is not applied. FIG. 11B is a magnetic field distribution diagram of the wireless power transmission device 100 according to an example embodiment to which the canceling coil 130 is applied. To compare these, it can be identified that a discrepancy has occurred in a distribution position of magnetic field, and that a magnitude of a maximum magnetic field has reduced to a level of ⅓.

Figure 12:
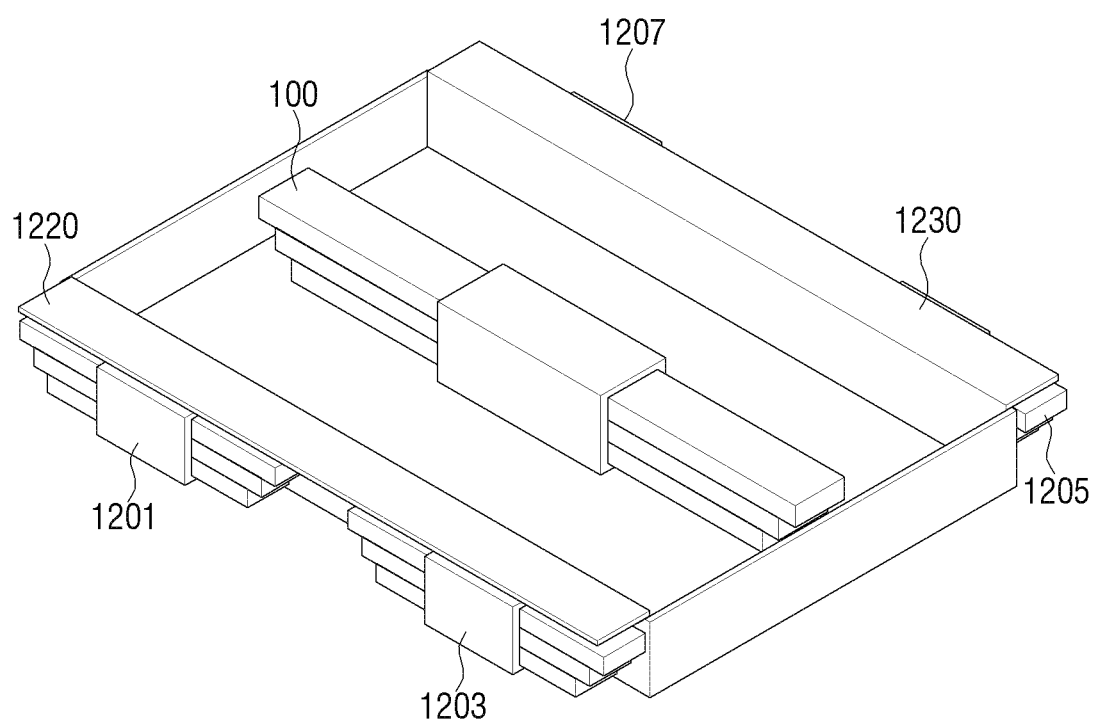
FIG. 12 is a diagram illustrating a wireless power transmission device, according to another example embodiment.

FIG. 12 is a diagram illustrating a wireless power transmission device 100, according to another example embodiment.

Referring to FIG. 12, the canceling coil 130 may be a canceling coil 1201, 1203, 1205 and 1207 which is a dipole coil shape using a core rather than a loop coil shape including a closed loop. A canceling coil of a dipole shape may include a first canceling coil 1201 and 1203 disposed in a front side area of the dipole coil 100, and a second canceling coil 1205 and 1207 disposed in a rear side area of the dipole coil 100.

In the embodiment of FIG. 12, the first canceling coil 1201 and 1203 and the second canceling coil 1205 and 1207 may respectively include two dipole coils. However, the number of canceling coils of a dipole shape respectively disposed on a front side and rear side of the dipole coil 100 may not be necessarily two. For example, the first and second canceling coils may be a single integral-type dipole coil. As another example, the first and second canceling coils may be a plurality of distribution-type dipole coils. As another example, the first canceling coil may include a single dipole coil, and the second canceling coil may include a plurality of dipole coils.

In addition, the first canceling coil 1201 and 1203 and the second canceling coil 1205 and 1207 themselves radiate a magnetic field, and thus a metal plate 1220 and 1230 may be disposed at an upper part of the respective canceling coils of a dipole shape. The metal plate 1220 and 1230 may cancel a magnetic field which is radiated from the upper parts of the first canceling coil 1201 and 1203 and the second canceling coil 1205 and 1207.

In addition, in the embodiment of FIG. 12, it is implemented such that a plurality of disc-type rectangular core members are disposed as being overlapped with each other, and thus such that the core is thickest at the center in the longitudinal direction and tapered toward both ends. However, a shape of the core is not limited thereto, and a thickness of the core may be uniform in the longitudinal direction.

According to the various embodiments described above, it is possible to use a dipole coil method which has a larger mutual inductance than a loop coil method and is advantageous in transmission of a long-distance wireless power transmission while canceling a leakage magnetic field and promoting safety of the user.

The foregoing example embodiments and advantages are merely exemplary and are not to be construed as limiting the present inventive concept. Accordingly, the scope of the present disclosure is not construed as being limited to the described exemplary embodiments, but is defined by the appended claims as well as equivalents thereto.

The invention claimed is:

1. A wireless power transmission device, comprising:
    a dipole coil comprising a core, and a conducting wire wound at the center part of the core;
    a power unit for supplying a current to the conducting wire; and
    a canceling coil for canceling a magnetic field radiated from a lateral surface of the dipole coil.

2. The wireless power transmission device as claimed in claim 1, wherein the canceling coil comprises:
    a first canceling coil which is disposed in a left area of the dipole coil; and
    a second canceling coil which is disposed in a right area of the dipole coil.

3. The wireless power transmission device as claimed in claim 2, wherein each of the first canceling coil and the second canceling coil has a shape that a rectangular closed line is bent twice in parallel.

4. The wireless power transmission device as claimed in claim 3, wherein the first canceling coil includes a front surface of a '9' shape with reference to the dipole coil, and an upper surface of a '[' with reference to the dipole coil, and
    wherein the second canceling coil includes a front surface of a '[' shape with reference to the dipole coil, and an upper surface of a ']' with reference to the dipole coil.

5. The wireless power transmission device as claimed in claim 2, wherein a portion of a left side of the dipole coil is disposed inside the first canceling coil, and
    wherein a portion of a right side of the dipole coil is disposed inside the second canceling coil.

6. The wireless power transmission device as claimed in claim 2, wherein the canceling coil further comprises:
    a plurality of third canceling coils of a rectangular closed line form which is disposed in parallel with a lateral surface of the dipole coil, between the first canceling coil and the second canceling coil.

7. The wireless power transmission device as claimed in claim 1, wherein the canceling coil comprises:
    a first canceling coil which is disposed in a front side area of the dipole coil; and
    a second canceling coil which is disposed in a rear side area of the dipole coil,
    wherein the first and second canceling coils have a dipole coil shape.

8. The wireless power transmission device as claimed in claim 7, wherein each of the first canceling coil and the second canceling coil has any one shape from among a single integral-type dipole coil and a plurality of distribution-type dipole coils.

9. The wireless power transmission device as claimed in claim 1, wherein the canceling coil is configured to:
    generate an induced electromotive force by a magnetic field radiated from the dipole coil; and
    radiate a canceling magnetic field to cancel a magnetic field radiated from the dipole coil based on the generated induced electromotive force.

10. The wireless power transmission device as claimed in claim 1, further comprising:
    a canceling power unit for supplying, to the canceling coil, a current to control the canceling coil to radiate a canceling magnetic field canceling a magnetic field radiated from the dipole coil.

11. The wireless power transmission device as claimed in claim 10, wherein the canceling power unit is configured to supply, to the canceling coil, a current with a phase difference of 180 degrees from a current supplied from the power unit.

12. The wireless power transmission device as claimed in claim 1, wherein the canceling coil has an impedance of an inductive load.

13. The wireless power transmission device as claimed in claim 1, further comprising:
    a metal plate which is disposed at a lower part or lateral surface of the dipole coil and cancels a magnetic field radiated from the lower part or lateral surface of the dipole coil.

14. The wireless power transmission device as claimed in claim 7, further comprising:
    a metal plate for canceling a magnetic field radiated from an upper part of the first canceling coil and the second canceling coil.

15. A wireless power transmission system, comprising:
    a wireless power reception device; and
    a wireless power transmission device, including:
        a first dipole coil including a first core, and a first conducting wire wound at the center part of the first core; and
        a canceling coil for canceling a magnetic field radiated from a direction other than a direction in which the wireless power reception device is disposed,
    wherein the wireless power reception device includes a second coil for generating a current when a magnetic field radiated from the wireless power transmission device is applied.

* * * * *